United States Patent [19]

Kato et al.

[11] Patent Number: 5,112,707
[45] Date of Patent: May 12, 1992

[54] MASK STRUCTURE FOR LITHOGRAPHY

[75] Inventors: Hideo Kato; Hirohumi Shibata, both of Yokohama; Keiko Matsushita, Tokyo; Osamu Takamatsu, Yokohama, all of Japan

[73] Assignee: Canon Kabushiki Kaisha, Tokyo, Japan

[21] Appl. No.: 534,875

[22] Filed: Jun. 8, 1990

Related U.S. Application Data

[63] Continuation of Ser. No. 398,309, Aug. 25, 1989, Pat. No. 4,956,249, which is a continuation of Ser. No. 910,309, Sep. 22, 1986, abandoned, Continuation of Ser. No. 652,107, Sep. 17, 1984, abandoned.

[30] Foreign Application Priority Data

Sep. 26, 1983 [JP] Japan ................. 58-177285
Sep. 26, 1983 [JP] Japan ................. 58-177286

[51] Int. Cl.$^5$ ................................ G03F 9/00
[52] U.S. Cl. ........................... 430/5; 430/296; 430/967; 428/427; 428/428; 378/35
[58] Field of Search ............ 430/5, 296, 967; 428/427, 428; 378/35

[56] References Cited

U.S. PATENT DOCUMENTS

| | | | |
|---|---|---|---|
| 4,037,111 | 7/1977 | Couquin et al. | 250/505 |
| 4,111,698 | 9/1978 | Sato | 96/79 |
| 4,171,489 | 10/1979 | Adams et al. | 250/510 |
| 4,579,616 | 4/1986 | Windischmann | 430/5 |
| 4,677,042 | 6/1987 | Kato et al. | 430/5 |
| 4,804,600 | 2/1989 | Kato et al. | 430/5 |
| 4,956,249 | 9/1990 | Kato et al. | 430/5 |

FOREIGN PATENT DOCUMENTS 1554420 10/1979 United Kingdom .
2101353 1/1983 United Kingdom .

Primary Examiner—Charles L. Bowers, Jr.
Assistant Examiner—Thomas R. Neville
Attorney, Agent, or Firm—Fitzpatrick, Cella, Harper & Scinto

[57] ABSTRACT

A mask structure for lithography including an annular base plate supporting a peripheral portion of a masking-material-holding film provided on a surface thereof with a desired pattern of the making material is provided which is characterized in that the masking-material-holding film and the base plate are bonded together at an outer peripheral surface, which is connected smoothly or with an appropriate angle to the topmost flat end surface of the base plate and is at a lower level than the topmost flat end surface of the base plate, or at a surface contiguous to the outer peripheral surface.

26 Claims, 3 Drawing Sheets

MASK STRUCTURE FOR LITHOGRAPHY

This application is a continuation of pending prior application Ser. No. 07/398,309, filed Aug. 25, 1989, now U.S. Pat. No. 4,956,249, which application is a continuation of prior application, Ser. No. 06/910,309 filed Sep. 22, 1986, now abandoned, which application is a continuation of prior application, Ser. No. 06/652,190 filed Sep. 19, 1984, also now abandoned.

BACKGROUND OF THE INVENTION

1. Field of the Invention

The present invention relates to an article of a mask structure for use in lithography.

2. Description of the Prior Art

A process for manufacturing various products by partial surface modification of workpieces using a lithographic technique is widely utilized in many industries, particularly in the electronic industry. This process enables mass-production of products having the same modification pattern on the surface. The surface modification of workpieces can be carried out by irradiation with various forms of energy, where masks provided locally with an irradiation-energy-intercepting material are used to form patterns. The mask hitherto used, when the irradiation energy is visible light, comprises a transparent substrate formed of glass, quartz, or the like which is coated with a pattern of black paint or laminated with a pattern of metal foil or the like opaque to visible light.

In recent years, X-rays and further corpuscular beams such as ion beams have come into use for irradiation with growing needs for the formation of finer patterns and for shorter lithographic processing time. The energy of these beams is absorbed for the most part by the glass or quartz plate which is used in the above-mentioned mask for screening visible light. Consequently, it is undesirable, when using such types of irradiation energy, to use a glass or quartz plate for the mask. Thus, the mask used for lithography wherein X-rays or corpuscular beams are employed for irradiation comprises (1) a film transparent to these beams which comprises an inorganic film such as silicon nitride, boron nitride and silicon oxide films, an organic film, such as polyimide, polyamide and polyester films, or a composite film of these materials and (2) an overlying pattern of a metal such as gold, platinum, nickel, palladium, rhodium and indium, opaque to these beams. This type of mask does not have a shape retaining ability by itself and is hence, supported by a suitable base. FIG. 1 shows a cross-sectional view of a typical example of the type of mask structure used up to now. This mask structure is constructed by bonding the peripheral portion of a masking-material holding film 2 (hereinafter referred simply to as a holding film) transparent to irradiation energy onto one side (the upper surface with respect to FIG. 1) of an annular base plate 3 with an adhesive 4, the holding film 2 being provided with a desired pattern of masking material 1, which can absorb irradiation energy, on the surface. FIG. 2 is a plan view of the annular base plate 3.

However, the above mask structure according to the prior art has difficulties in securing the flatness of the holding film 2, since the following defects may result depending upon the method of applying the adhesive 4: the thickness of the adhesive layer 4 may be uneven, the adhesive 4 may flow out of the perimeter of the holding film 2, or peripheral parts of the holding film 2 may peel off on trimming the perimeter. These defects tend to cause inaccuracy in lithography.

SUMMARY OF THE INVENTION

An object of the present invention is to provide an article of a mask structure for lithography constructed by bonding a masking-material-holding film onto a base plate, wherein the flatness of the holding film is improved.

According to one aspect of the present invention, there is provided an article of a mask structure for lithography comprising an annular base plate supporting a peripheral portion of a masking-material-holding film provided on a surface thereof with a desired pattern of the masking material, which is characterized in that the masking-material-holding film and the base plate are bonded together at an outer peripheral surface which is not coplanar and is smoothly connected to the topmost flat end surface of the base plate and is at a lower level than the topmost flat end surface non-coplanar of the base plate or at a surface contiguous to the outer peripheral surface.

According to another aspect of the invention, there is provided an article of a mask structure for lithography comprising an annular base plate supporting a peripheral portion of a masking-material-holding film provided on a surface thereof with a desired pattern of the masking material, which is characterized in that the masking-material-holding film and the base plate are bonded together at an outer peripheral surface non-coplanar at a lower level than the topmost flat end surface of the base plate at an appropriate angle therewith, or at a surface contiguous to the outer peripheral surface.

DETAILED DESCRIPTION OF PREFERRED EMBODIMENTS

Figure 1:
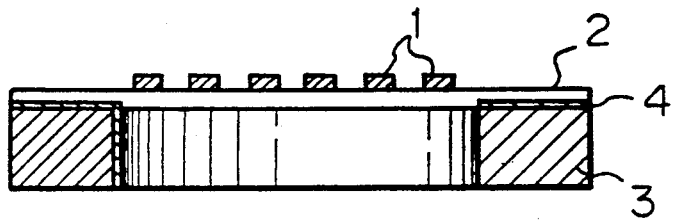
FIG. 1 illustrates a cross-sectional view of a mask structure according to the prior art.
Figure 2:
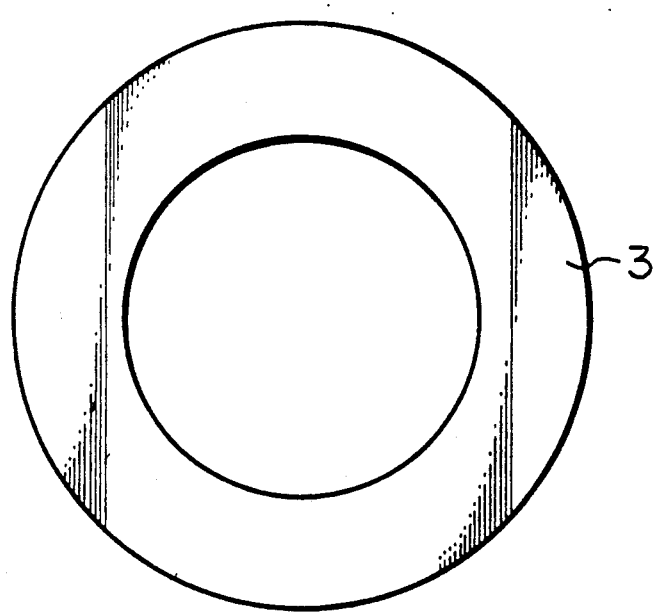
FIG. 2 illustrates a plan view of the base plate of the mask structure according to the prior art.
Figure 3:
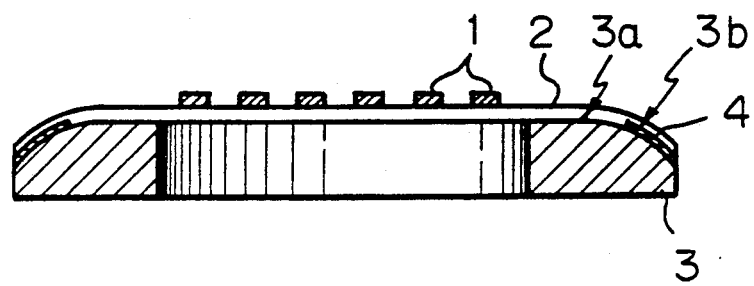
FIGS. 3, 5 and 7 are cross-sectional views of embodiments of the mask structure according to the present invention.
Figure 4:
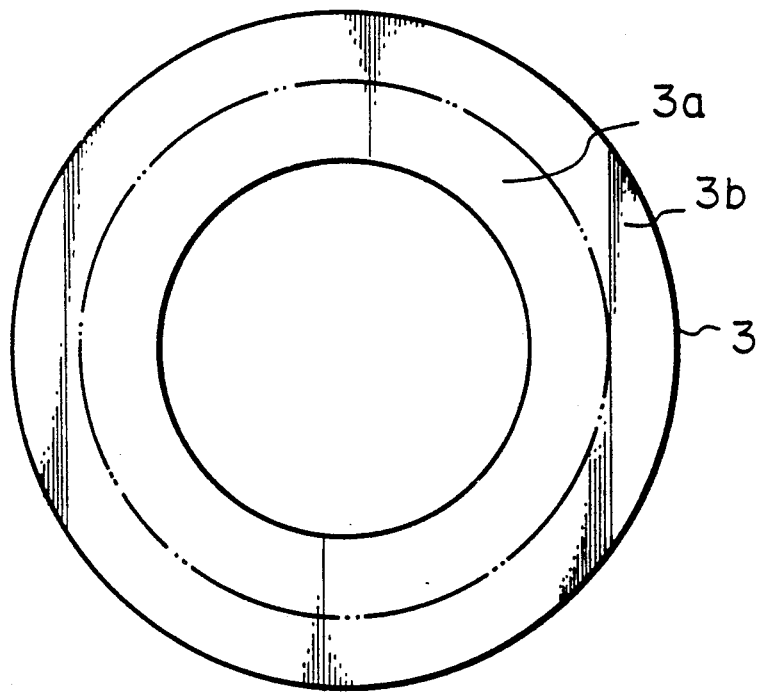
FIGS. 4 and 6 are plan views of the base plates of the embodiments shown in FIGS. 3 and 5, respectively.

FIG. 3 illustrates a cross-sectional view of the first embodiment of the mask structure according to the invention. A masking material 1 having a desired pattern is laid upon a surface of a holding film 2. The masking material 1 is formed of a thin film about 0.7 μ thick of, for example, gold, platinum, nickel, palladium, rhodium, or indium. The holding film 2 is formed of an inorganic material, for example, silicon nitride, boron nitride, or silicon oxide, or an organic material, for example, polyimide, polyamide, or polyester, to a thickness of, e.g. 2–12 μ. The holding film 2 is bonded at the peripheral portion of the surface onto an annular base plate 3 through an adhesive 4. FIG. 4 shows a plan view of the base plate 3. The adhesive 4 is applied not on the top flat end surface 3a of the base plate 3, but only on the outer curved annular surface 3b contiguous to the surface 3a. The base plate 3 is formed of, for example, silicon, glass, quartz, phosphor bronze, brass, nickel, or stainless steel. For the adhesive 4, any type may be used, for example, solvent type, heat curable type, or photocurable type, suitably selected from epoxy series, rubber series, and other series adhesives.

Figure 5:
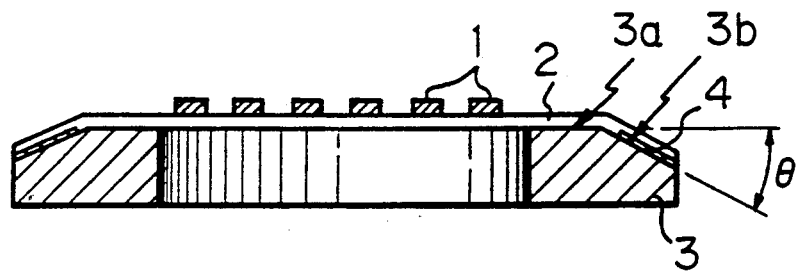

FIG. 5 illustrates a cross-sectional view of the second embodiment of the mask structure according to the invention. In FIG. 5, like numerals as in FIGS. 3 and 4 are used for the like parts.

Figure 6:
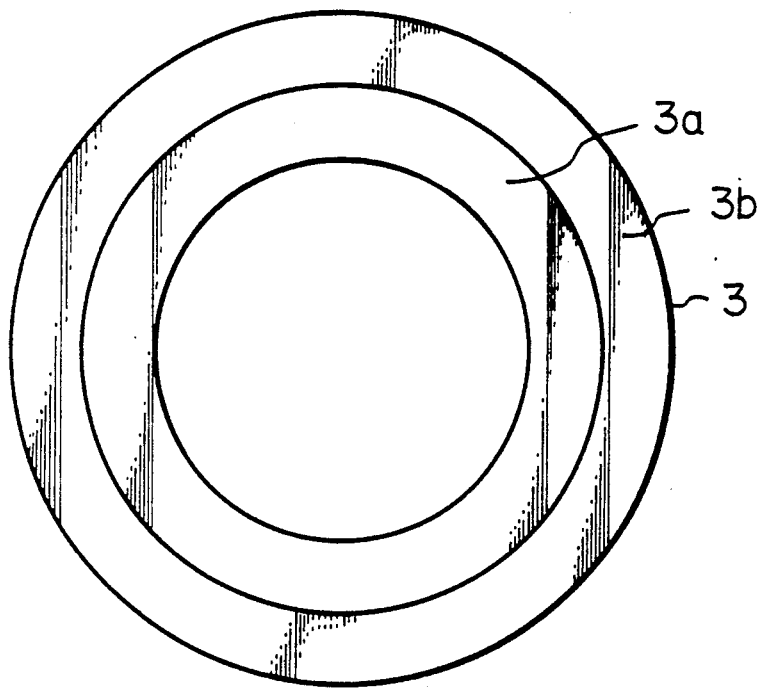

Also in this mask structure, a masking material 1 having a desired pattern is laid upon a surface of holding film 2, which is bonded at the peripheral portion of the surface onto an annular base plate 3 through an adhesive 4. FIG. 6 illustrates a plan view of the base plate 3. The adhesive 4 is applied not on the top flat end surface 3a of the base plate 3, but on the outer slanting annular surface 3b meeting the surface 3a at an angle $\theta$. The angle $\theta$ is not particularly limited, provided that it exceeds 0°, but is usually 15–30°.

Figure 7:
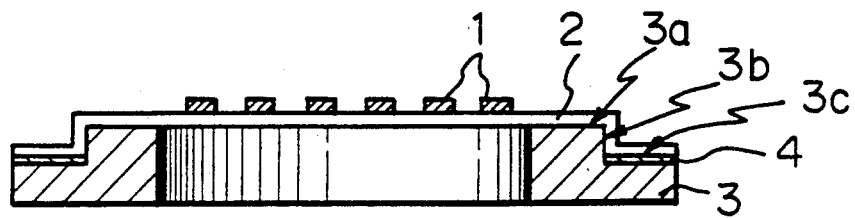

FIG. 7 is a cross-sectional view of the third embodiment of the mask structure according to the invention. This case corresponds to the one where the angle $\theta$ is 90° and additionally the third area 3c serves as the surface on which the adhesive 4 is applied.

In the above embodiments, marginal parts of the holding film 2 that protrude out of the perimeter of the base plate 3, depending upon the configuration thereof, may be previously cut off.

According to the mask structure of the invention described hereinbefore, a satisfactory flatness of the masking-material-holding surface can be secured without being affected by the application of the adhesive 4 or by the cutoff of peripheral parts of the holding film 2, since the holding film 2 and the base plate 3 are bonded together at a surface other than the plane including the masking-material-holding surface of the holding film 2. Moreover, in the first embodiment, the holding film 2 is bonded to the base plate 3 at the outer annular area thereof which is smoothly connected to the top flat end surface area of the base plate 3 and is curved downward. Therefore an external force is distributed evenly on the masking-material-holding flat plane of the holding film 2, thus further improving the flatness of that plane.

What we claim is:

1. A mask structure for lithography, comprising:
   (a) a base plate having a top flat end surface whose peripheral edge is chamfered so as to define a bonding surface; and
   (b) a masking-material-holding film spanning the top flat end surface and bonded only to the chamfered peripheral edge that defines the bonding surface.

2. A mask structure according to claim 1, wherein said masking-material-holding film is provided with a film-shaped masking material on the surface thereof.

3. A mask structure according to claim 2, wherein said masking material is patterned.

4. A mask structure for lithography according to claim 1, wherein said base plate is formed from at least one material selected from the group consisting of silicon, glass, quartz, phosphor bronze, brass, nickel and stainless steel.

5. A mask structure for lithograph according to claim 1, wherein said masking-material holding film has a thickness of between 2 and 12 um.

6. A mask structure for lithography according to claim 1, wherein said bonding is effected by an adhesive.

7. A mask structure for lithography according to claim 6, wherein said adhesive is at least one selected from the group consisting of solvent type, heat curable type and photocurable type.

8. A mask structure for lithography according to claim 6, wherein said adhesive is at least one selected from epoxy series and rubber series.

9. A mask structure for lithography according to claim 1, wherein said bonding surface is a curved surface.

10. A mask structure for lithography according to claim 1, wherein said bonding surface is a flat surface.

11. A mask structure for lithography according to claim 1, wherein said bonding surface is a flat surface and the meeting angle formed by said top flat end surface and said bonding surface is 15 and 30 degrees.

12. A mask structure for lithography according to claim 8, wherein said base plate is formed from at least one material selected from the group consisting of silicon, glass, quartz, phosphor bronze, brass, nickel and stainless steel.

13. A mask structure for lithography according to claim 2, wherein said masking material is formed from at least one material selected from the group consisting of gold, platinum, nickel, palladium, rhodium and indium.

14. A mask structure for lithography according to claim 3, wherein said masking material is formed from at least one material selected from the group consisting of gold, platinum, nickel, palladium, rhodium and indium.

15. A mask structure for lithography, comprising:
   (a) a base plate having a top flat end surface and a bonding surface located below the top flat end surface; and
   (b) a masking-material-holding film spanning the top flat end surface and bonded only to the bonding surface.

16. A mask structure according to claim 15, wherein said masking-material-holding film is provided with a film-shaped masking material on the surface thereof.

17. A mask structure according to claim 16 wherein said masking material is patterned.

18. A mask structure for lithography according to claim 15, wherein said masking-material-holding film has a thickness of between 2 and 12 um.

19. A mask structure for lithography according to claim 15, wherein said bonding is effected by an adhesive.

20. A mask structure for lithography according to claim 19, wherein said adhesive is at least one selected from the group consisting of solvent type, heat curable type and photocurable type.

21. A mask structure for lithography according to claim 19, wherein said adhesive is at least one selected from the group consisting of epoxy series and rubber series.

22. A mask structure for lithography according to claim 15, wherein said bonding surface is located in a plane lower than the plane of said top flat end surface.

23. A mask structure for lithography according to claim 15, wherein the base plate at the portion of said bonding surface has a thickness that is smaller than a thickness of the base plate at the portion of said top flat end surface.

24. A mask structure for lithography according to claim 16, wherein said masking material is formed from at least one material selected from the group consisting of gold, platinum, nickel, palladium, rhodium and indium.

25. A mask structure for lithography according to claim 17, wherein said masking material is formed from at least one material selected from the group consisting of gold, platinum, nickel, palladium, rhodium and indium.

26. A mask structure for lithography, comprising:
(a) an annular base plate having a top flat end surface and a peripheral edge that is tapered so as to define a flat bonding surface, whereby the thickness of said annular base plate at the portion of said flat bonding surface is decreased toward the outer edge of said base plate by the taper; and
(b) a masking-material-holding film spanning the top flat end surface and bonded by an adhesive only to the tapered peripheral edge as a bonding surface.

* * * * *

UNITED STATES PATENT AND TRADEMARK OFFICE
CERTIFICATE OF CORRECTION

PATENT NO. : 5,112,707

DATED : May 12, 1992

INVENTOR(S) : Hideo Kato, et al.

It is certified that error appears in the above-identified patent and that said Letters Patent is hereby corrected as shown below:

ON THE TITLE PAGE, item [63],

IN THE RELATED U.S. APPLICATION DATA

"Ser. No. 652,107, Sep. 17, 1984, abandoned." should read --Ser. No. 652,190, Sep. 19, 1984, abandoned.--.

IN THE ABSTRACT, item [57],

Line 5

"making" should read --masking--.

COLUMN 2

Line 21, "non-coplanar" should be deleted;
Line 22, "surface" should read --non-coplanar surface--;
Line 31, "peripheral surface" should be deleted; and
Line 32, "coplanar" should read --coplanar peripheral surface--.

UNITED STATES PATENT AND TRADEMARK OFFICE
CERTIFICATE OF CORRECTION

PATENT NO. : 5,112,707
DATED : May 12, 1992
INVENTOR(S) : Hideo Kato, et al.

It is certified that error appears in the above-identified patent and that said Letters Patent is hereby corrected as shown below:

COLUMN 3

Line 61, "lithograph" should read --lithography--.

COLUMN 4

Line 16, "claim 8," should read --claim 15,--.

Signed and Sealed this

Seventeenth Day of August, 1993

Attest:

BRUCE LEHMAN

Attesting Officer     Commissioner of Patents and Trademarks